United States Patent
Zhao et al.

(10) Patent No.: US 10,916,692 B2
(45) Date of Patent: Feb. 9, 2021

(54) PIEZOELECTRIC DETECTION CIRCUIT, METHOD AND DISPLAY DEVICE

(71) Applicant: BOE TECHNOLOGY GROUP CO., LTD., Beijing (CN)

(72) Inventors: Lijun Zhao, Beijing (CN); Haisheng Wang, Beijing (CN); Yingming Liu, Beijing (CN); Yuzhen Guo, Beijing (CN); Yanan Jia, Beijing (CN); Changfeng Li, Beijing (CN); Pinchao Gu, Beijing (CN); Yunke Qin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 515 days.

(21) Appl. No.: 15/918,792

(22) Filed: Mar. 12, 2018

(65) Prior Publication Data
US 2019/0067556 A1 Feb. 28, 2019

(30) Foreign Application Priority Data
Aug. 29, 2017 (CN) .......................... 2017 1 0757302

(51) Int. Cl.
*H01L 41/113* (2006.01)
*H04R 17/02* (2006.01)
(Continued)

(52) U.S. Cl.
CPC ............ *H01L 41/1132* (2013.01); *G01L 1/16* (2013.01); *G01L 1/167* (2013.01); *G06F 3/0414* (2013.01); *G06F 3/0416* (2013.01); *H01L 41/042* (2013.01); *H01L 41/0478* (2013.01); *H01L 41/193* (2013.01); *H04R 17/02* (2013.01); *G02F 1/13338* (2013.01);
(Continued)

(58) Field of Classification Search
CPC ............... H01L 41/1132; H01L 41/042; H01L 41/0478; H01L 41/193; H01L 27/3225; H01L 27/323; G01L 1/16; G01L 1/167; G06F 3/0414; G06F 3/0416; H04R 17/02; H04R 2201/003; H04R 2449/15; G02F 1/13338; G02F 2001/133394
USPC ........................................ 310/318, 319, 339
See application file for complete search history.

(56) References Cited

U.S. PATENT DOCUMENTS

| | | | |
|---|---|---|---|
| 2012/0057430 A1* | 3/2012 | Rouquette | G01V 1/38 367/24 |
| 2017/0255338 A1* | 9/2017 | Medina | G06F 3/0414 |

(Continued)

*Primary Examiner* — Thomas M Dougherty
(74) *Attorney, Agent, or Firm* — Dinsmore & Shohl LLP

(57) ABSTRACT

The present disclosure relates to piezoelectric detection circuits, methods and display devices. A piezoelectric detection circuit is provided that may comprise: a piezoelectric device to convert a pressure into a direct current (DC) signal and to convert a sound wave into an alternating current (AC) signal; a comparison circuit configured to output the direct current signal to a signal processor in a case where the piezoelectric device outputs DC signal, and to output the alternating current signal to the mixer in a case where the piezoelectric device outputs AC signal; the mixer configured to perform a mixing process on the AC signal to generate a mixed signal; and the signal processor configured to process the mixed signal output from the mixer or the direct current signal output from the comparison circuit, to detect the pressure or the sound.

14 Claims, 6 Drawing Sheets

(51) Int. Cl.
*H01L 41/04* (2006.01)
*H01L 41/193* (2006.01)
*H01L 41/047* (2006.01)
*G01L 1/16* (2006.01)
*G06F 3/041* (2006.01)
*G02F 1/1333* (2006.01)
*H01L 27/32* (2006.01)
*H01L 51/52* (2006.01)

(52) U.S. Cl.
CPC ............ *G02F 2001/133394* (2013.01); *H01L 27/323* (2013.01); *H01L 27/3225* (2013.01); *H01L 51/5253* (2013.01); *H04R 2201/003* (2013.01); *H04R 2499/15* (2013.01)

(56) References Cited

U.S. PATENT DOCUMENTS

| | | | |
|---|---|---|---|
| 2019/0043920 A1* | 2/2019 | Berger | G01N 29/28 |
| 2019/0145806 A1* | 5/2019 | Lim | G01F 1/66 |
| | | | 73/861.27 |
| 2019/0329266 A1* | 10/2019 | Gerteis | B02C 23/16 |

* cited by examiner

PIEZOELECTRIC DETECTION CIRCUIT, METHOD AND DISPLAY DEVICE

CROSS REFERENCE TO THE RELATED APPLICATION

The present application claims priority to and the benefit of Chinese Application No. 201710757302.7, filed on Aug. 29, 2017, which is herein incorporated in its entirety by reference.

TECHNICAL FIELD

The present disclosure relates to the field of display technology, and in particular, to a piezoelectric detection circuit, a method and a display device.

BACKGROUND

Most of the current sensors can only achieve a single function, for example, can only achieve a piezoelectric detection function, or, can only achieve acoustic detection. In the application where multi-functions are required at the same time, basically, a variety of sensors are integrated and coordinated with each other to achieve sophisticated or complex functions. The integration of a variety of sensors may make the device more complex, is disadvantageous for miniaturization and integration in the display device, and is not disadvantageous for reducing costs and power consumption.

SUMMARY

The embodiments of the present disclosure provide a piezoelectric detection circuit, a method, and a display device. According to some embodiments of the present disclosure, the integration of various sensor functions may be achieved.

According to an aspect of the present disclosure, a piezoelectric detection circuit is provided that may comprise: a piezoelectric device configured to convert a pressure applied thereto into a direct current (DC) signal and to convert a sound wave of a sound applied thereto into an alternating current (AC) signal; a comparison circuit configured to output the DC signal to a signal processor in a case where it is determined that the piezoelectric device outputs DC signal, and to output the AC signal to a mixer in a case where it is determined that the piezoelectric device outputs AC signal; the mixer configured to perform a mixing process on the AC signal to generate a mixed signal; and the signal processor configured to process the mixed signal output from the mixer or the DC signal output from the comparison circuit, to detect the pressure or the sound.

In some embodiments, the signal processor may comprise an analog-to-digital converter and a digital signal processor, wherein the analog-to-digital converter is configured to convert the mixed signal or the DC signal into a digital signal; and the digital signal processor is configured to process the digital signal to identify the pressure corresponding to the DC signal or the sound corresponding to the AC signal.

In some embodiments, the piezoelectric device may comprise one or more piezoelectric sensors which are provided independently of each other, the piezoelectric sensor comprising: an upper electrode, a piezoelectric material layer and a lower electrode which are stacked.

In some embodiments, the piezoelectric material layer may comprise a polymer material.

In some embodiments, at least one of the upper electrode or the lower electrode is an organic conductive material electrode; and wherein the piezoelectric sensor may further comprise: a frame-type electrode formed of a metal material and electrically coupled to the organic conductive material electrode, wherein shapes respectively formed by outer edges and inner edges of the frame-type electrode are consistent with a shape formed by outer edges of the organic conductive material electrode.

In some embodiments, the comparison circuit may comprise: a comparator configured to compare the electrical signal output from the piezoelectric device with a preset threshold to determine whether the piezoelectric device outputs DC signal or AC signal; and a splitter configured to output, based on the result of the determination, the DC signal to the signal processor and the AC signal to the mixer.

According to another aspect of the present disclosure, a display device is provided that comprises a display panel and the piezoelectric detection circuit according to any embodiment of the present disclosure.

In some embodiments, the display device may further comprise: a cover covering the display panel, wherein the piezoelectric device of the piezoelectric detection circuit is disposed on a side of the cover facing the display panel.

In some embodiments, the display panel may be a liquid crystal display panel. In some embodiments, the liquid crystal display panel may comprise: an array substrate and an opposite substrate arranged opposite to each other, and a liquid crystal layer provided between the opposite substrate and the array substrate; and the piezoelectric device is disposed at any one of: a side of the opposite substrate facing the liquid crystal layer, a side of the array substrate facing the liquid crystal layer, a side of the opposite substrate facing away from the liquid crystal layer, or a side of the array substrate facing away from the liquid crystal layer.

In some embodiments, the display panel may be an organic electroluminescent display panel. In some embodiments, the organic electroluminescent display panel may comprise: a base substrate, an organic electroluminescent device disposed on the base substrate, and an encapsulating film layer covering the organic electroluminescent device; and the piezoelectric device is disposed at any one of: a side of the encapsulating film layer facing away from the organic electroluminescent device, between the encapsulating film layer and the organic electroluminescent device, or a side of the base substrate facing away from the organic electroluminescent device.

In some embodiments, the piezoelectric device in the piezoelectric detection circuit may be located in a non-display area of the display panel, or located in a display area and a non-display area of the display panel.

According to a yet another aspect of the present disclosure, a method is provided that comprises: converting, with a piezoelectric device, a pressure applied to the piezoelectric device to a direct current (DC) signal, and a sound wave of a sound applied to the piezoelectric device to an alternating current (AC) signal; determining, with a comparison circuit, whether the piezoelectric device outputs DC signal or AC signal, and outputting the DC signal to a signal processor in the case where it is determined that the piezoelectric device outputs DC signal, and the AC signal to a mixer in the case where it is determined that the piezoelectric device outputs AC signal; mixing, with the mixer, the AC signal to generate a mixed signal; and processing, with the signal processor, the mixed signal output from the mixer or the DC signal output from the comparison circuit to detect the pressure or the sound.

In some embodiments, the signal processor may comprise an analog-to-digital converter and a digital signal processor, and wherein processing, with the signal processor, the mixed signal output from the mixer or the DC signal output from the comparison circuit to detect the pressure or the sound comprises: converting, with the analog-to-digital converter, the mixed signal or the DC signal into a digital signal; and processing, with the digital signal processor, the digital signal to identify the pressure corresponding to the DC signal or the sound corresponding to the AC signal.

In some embodiments, said determining and outputting may comprise: comparing, with a comparator, the electrical signal output from the piezoelectric device with a preset threshold to determine whether the piezoelectric device outputs DC signal or AC signal; and outputting, with a splitter based on the result of the determination, the DC signal to the signal processor and the AC signal to the mixer.

According to the embodiments of the present disclosure, a pressure detection and a sound wave detection function can be implemented by using a single piezoelectric device, thus the detection circuit can be simplified, and it is advantageous for the integration thereof into the display device. According to the embodiments of the present disclosure, it is also possible to reduce the cost and power consumption of the detection circuit and the display device.

BRIEF DESCRIPTION OF DRAWINGS

Herein, the accompanying drawings, which are incorporated in and constitute a part of this specification, illustrate embodiments of the present disclosure and, together with the description, serve to explain the principles of the present disclosure, in which:

FIG. 3b is a top view corresponding to FIG. 3a;

It should be understood that the shapes and sizes of the various elements/components in the figures do not necessarily reflect the real shapes and sizes, and the drawings are only intended to illustrate certain embodiments of the present disclosure.

DETAILED DESCRIPTIONS OF EMBODIMENTS

Piezoelectric detection circuits, detection methods and display devices according to embodiments of the present disclosure will be described in detail below with reference to the accompanying drawings.

Figure 1:
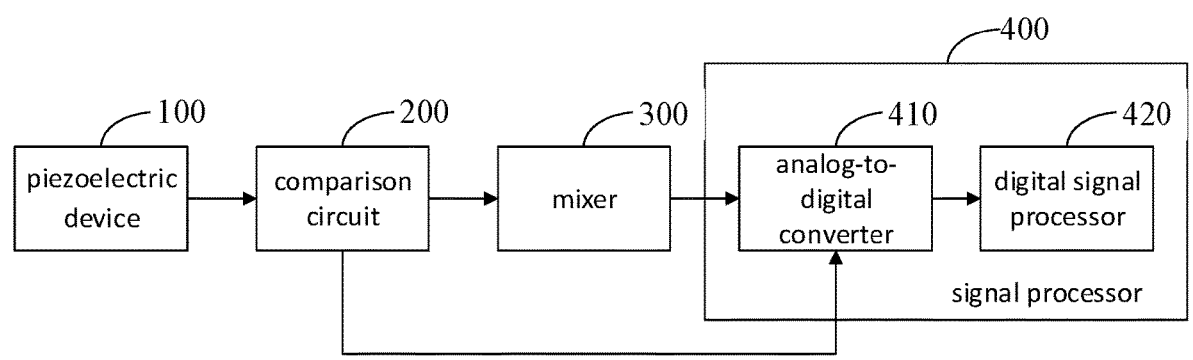
FIG. 1 is a schematic structural diagram of a piezoelectric detection circuit according to an embodiment of the present disclosure.

According to some embodiments of the present disclosure, a piezoelectric detection circuit is provided. As shown in FIG. 1, the piezoelectric detection circuit may include a piezoelectric device 100, a comparison circuit 200 electrically connected with the piezoelectric device 100, a mixer 300 electrically connected with the comparison circuit 200, and a signal processor 400 electrically connected to the mixer 300 and the comparison circuit 200.

Piezoelectric device 100 may be used to generate a corresponding electrical signal based on the force or vibration it is subjected to. In general, piezoelectric material is polarized when subjected to a pressure, and polarized with an opposite polarization direction when subjected to a tension. Thus, piezoelectric material, when subjected to vibrations, may produce a polarization in a direction in a portion of the vibration period and produce a polarization in an opposite direction in anther portion of the vibration period.

In some implementations, pressure may be generated by tangible physical objects (such as, but not limited to, fingers, stylus, etc.) acting on the piezoelectric device. In such a case, the piezoelectric device may generate a polarization in a certain polarization direction; the amount of charge generated by the polarization (in other words, the degree of polarization) may vary, but the polarization direction (relative to the initial state) basically does not change.

On the other hand, the piezoelectric device may possibly be deformed by applying a vibration such as waves of sound on the piezoelectric device. In such a case, the polarization direction of the piezoelectric device may change with vibration.

Therefore, the piezoelectric device 100 can be configured to convert the pressure it receives into a DC signal, and convert the sound waves of the received sound into an AC signal.

The comparison circuit 200 may be configured to determine whether the piezoelectric device 100 outputs a direct current (DC) signal or an alternating current (AC) signal. In the case where it is determined that the piezoelectric device 100 outputs direct current signal, the comparison circuit 200 outputs the direct current signal to the signal processor. In the case where it is determined that the piezoelectric device 100 outputs alternating current signal, the comparison circuit 200 outputs the alternating current signal to the mixer 300.

The mixer 300 may be configured to perform a mixing process on the received alternating current signal to generate a mixed signal. The signal processor 400 may be configured to process the mixed signal output from the mixer 300 or the direct current signal output from the comparison circuit 200 to detect the pressure or the sound.

According to the embodiments of the present disclosure, it is possible to realize the functions of pressure sensing and microphone. According to an embodiment of the present disclosure, the piezoelectric device 100 may convert a pressure signal into a corresponding DC signal in a case of detecting a pressure; and in the case of implementing a microphone function (i.e., detecting a sound or a sound wave), the piezoelectric device 100 can convert acoustic signals into corresponding alternating current signals. In the case where the comparison circuit 200 determines that the piezoelectric device 100 outputs direct current signal, the comparison circuit 200 outputs the direct current signal directly to the signal processor 400, so that the pressure can be identified or determined. When the comparison circuit 200 determines that the piezoelectric device 100 outputs AC signal, the comparison circuit 200 outputs the AC signal to the mixer 300, and the mixed signal resulted from the AC signal underwent a mixing process by the mixer 30 is outputted to the signal processor 400 so that the sound can be identified. In this way, a single piezoelectric device can be used for both of pressure sensing and acoustic wave detection. Therefore, it is possible to simplify the detection circuit and facilitate the integration of the detection circuit into the display device. In addition, the cost and power consumption of the detection circuit can be reduced.

In some implementations, the functions of the pressure detection and the microphone (sound wave detection) can be used non-simultaneously in the operation of the piezoelectric detection circuit. Therefore, only an acoustic signal or a pressure signal may be collected by the piezoelectric device 100 at a time. In general, for sound waves to which a microphone is designed and directed to, the frequency of the AC signal transduced by the piezoelectric device 100 from the sound waves is generally in a range of 20 Hz to 20 kHz (i.e., basically corresponding to the human audible sound frequencies), and the pressures can be converted by the piezoelectric device 100 to DC signals with different amplitudes. Therefore, the comparison circuit 200 may determine whether the electrical signal output by the piezoelectric device 100 is an alternating current (AC) electrical signal corresponding to the acoustic signal (e.g., sound) or a direct current electrical signal corresponding to the pressure, by comparing the amplitude or the voltage value of the electrical signal output from the piezoelectric device.

Based on this, in some embodiments, the comparison circuit 200 may be configured to compare the electrical signal output by the piezoelectric device with a preset threshold. When, for example, the magnitude of the electrical signal output by the piezoelectric device is greater than the preset threshold, it may be determined that the piezoelectric device outputs alternating current signal. When, for example, the magnitude of the electrical signal output by the piezoelectric device is less than or equal to the preset threshold, it may be determined that the piezoelectric device outputs direct current signal.

Figure 10:
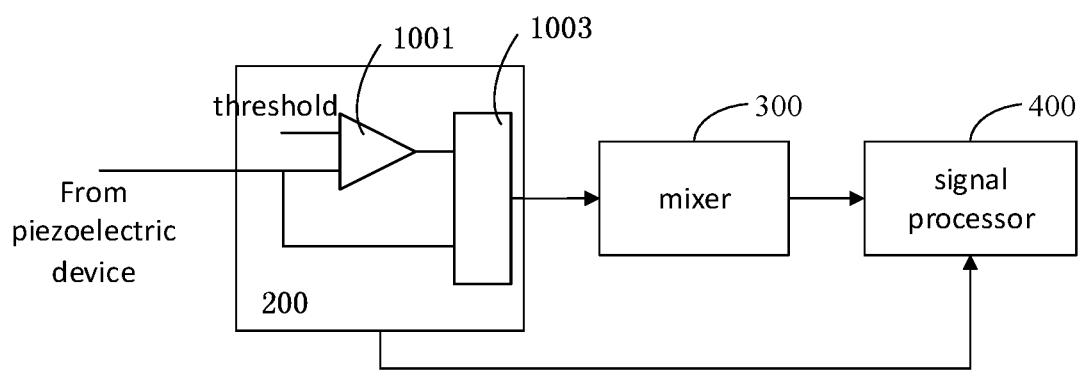
FIG. 10 illustrates a specific example of a comparison circuit according to an embodiment of the present disclosure.

For example, in some embodiments, as shown in FIG. 10, the comparison circuit 200 may include a comparator 1001 and a splitter 1003. The comparator 1001 may compare the electrical signal output from the piezoelectric device with a preset threshold value to determine whether the piezoelectric device outputs a direct current signal or an alternating current signal. For example, in some examples, when it is determined that the signal output from the piezoelectric device is a DC signal, the comparator 1001 may output a logic 1; and when it is determined that the signal output from the piezoelectric device is an AC signal, the comparator 1001 may output a logic 0. The splitter 1003 may output the DC signal to the signal processor and output the AC signal to the mixer, according to the determined result.

Figure 2:
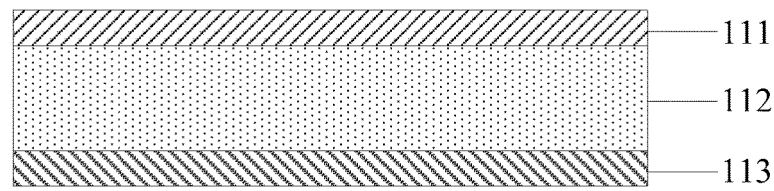
FIG. 2 is a schematic structural diagram of a piezoelectric device in a piezoelectric detection circuit according to an embodiment of the present disclosure.

In some embodiments, as shown in FIG. 2, the signal processor 400 may comprise an analog-to-digital converter 410 and a digital signal processor 420. The electrical signal output from the piezoelectric device 100 to the comparison circuit 200 is an analog signal. The electrical signal output from the mixer 300 or the comparison circuit 200 may also be an analog signal. Therefore, the analog signal may be analog-to-digital converted into digital signal for analysis, which may be also conducive to the subsequent storage and analysis.

The analog-to-digital converter 410 may be configured to convert the received mixed signal or the received direct current signal into a digital signal. The digital signal processor 420 may be configured to process the digital signal (i.e., the digital signal converted from the mixed signal, or the digital signal converted from the DC signal) to identify the pressure corresponding to the direct current signal or the sound corresponding to the alternating current signal.

According to different embodiments, the signal processor may be implemented in hardware, software or firmware. For example, the signal processor may be implemented with a circuitry, and therefore, the signal processor may also be referred to as a signal processing circuit. In some implementations, the signal processor may include a general purpose processor (e.g., a CPU) and instructions for execution by the general purpose processor. In some implementations, the signal processor may also include a memory for storing instructions. The instructions may include, but are not limited to, instructions for signal processing, and the like.

A microphone capable of acoustoelectric conversion can also be regarded as a pressure sensor, which can also be realized by a piezoelectric sensor. In some embodiments, in order to better acquire acoustic signals, the piezoelectric device 100 may include a plurality of piezoelectric sensors 110 disposed separately from each other. That is, the piezoelectric device 100 may be configured as an array of piezoelectric sensors. As shown in FIG. 2, each of the piezoelectric sensors 110 may specifically include an upper electrode 111, a piezoelectric material layer 112 and a lower electrode 113 that are stacked. In the piezoelectric sensor 110, the piezoelectric material layer 112, in the presence of pressure or sound waves, may generate an electrical signal (e.g., a voltage signal) according to the piezoelectric effect of the piezoelectric material layer 112. After being output from the upper electrode 111 or the lower electrode 113, the electrical signal can be processed by the subsequent comparison circuit 200, mixer 300 and signal processor 400 to realize the functions of pressure detection and sound detection.

In some embodiments, the piezoelectric material layer 112 may be configured to have a higher sensitivity in order to achieve a better conversion of acoustic signals into voltage signals. Therefore, the material of the piezoelectric material layer 112 may generally be selected from polymer materials, such as polyvinylidene fluoride (PVDF) or the like.

Figure 3A:
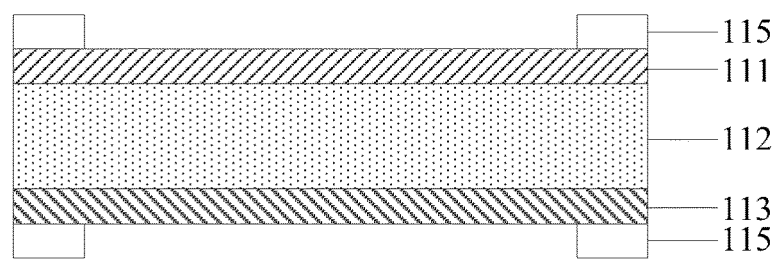
FIG. 3a is another schematic structural diagram of a piezoelectric device in a piezoelectric detection circuit according to an embodiment of the present disclosure.
Figure 3B:
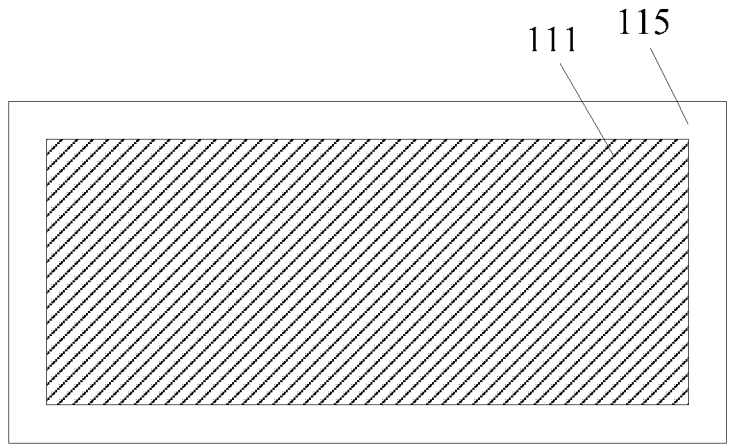

In some embodiments, the material of the upper electrode 111 and/or the lower electrode 113 may be selected from opaque metal materials, such as Au, Ag and the like. The upper electrode 111 and/or the lower electrode 113 may also be made of a transparent organic material, such as PEDOT, carbon nanotube (CNT), or other transparent material(s). When the upper electrode 111 and/or the lower electrode 113 is an organic conductive material electrode, in order to reduce the resistance, the piezoelectric sensor 110 may further include an electrode 115 coupled to a corresponding organic conductive material electrode. As shown in FIG. 3a and FIG. 3b, the electrode 115 may be disposed in a stack with the organic conductive material electrode. FIGS. 3a and 3b illustrate an example in which both the upper electrode 111 and the lower electrode 113 both are organic conductive material electrodes. In the example shown in FIG. 3b, the shape of the electrode 115 is frame-shaped. In other words, the electrode 115 may have a frame-like shape. Obviously, the present disclosure shall not be limited thereto. The frame-type electrode 115 may be shaped to conform to, or consistent with, the outer edges of the organic conductive material electrode. For example, as shown in FIG. 3b, the outer edges of the frame-type electrode 115 may be formed in a same or similar shape as that formed by the outer edges of the organic conductive material electrode 111 or 113. The inner edges of the frame-type electrode 115 may form a shape which is the same as or similar with that formed by the outer edges thereof and which may have a reduced size. In some implementations, as shown in FIG. 3b, the outer edges of the framed electrode 115 may be substantially aligned with the outer edges of the organic conductive material electrode 111 or 113. The material of the frame-type electrode 115 may comprise metal material(s). In the case that the frame-type electrode 115 is an opaque electrode, the frame-type electrode 115 may be disposed in the fringe area (for example, the most-outside edge area) of the piezoelectric device 100 so as not to affect influence on the light transmitting area of the piezoelectric device 100. In this way, the piezoelectric detection circuit can be advantageously integrated into the display device.

Figure 4:
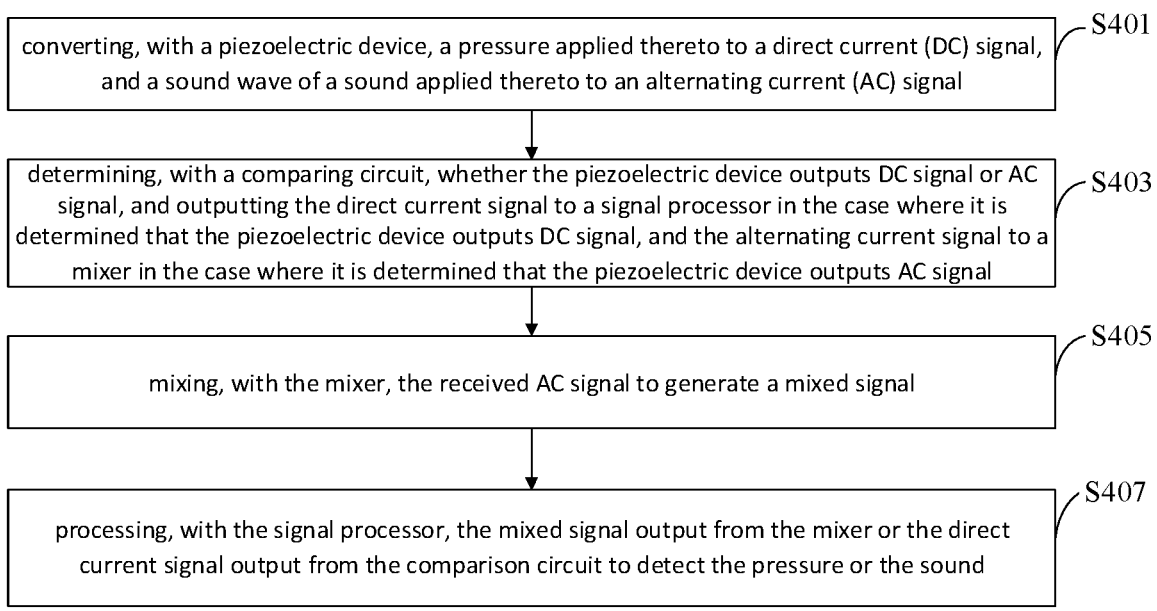
FIG. 4 is a flowchart of a detecting method for a piezoelectric detection circuit according to an embodiment of the present disclosure.

According to some embodiments of the present disclosure, a method is also provided that can be used to detect pressure or sound waves and the like. FIG. 4 shows a method according to an embodiment of the present disclosure. As shown in FIG. 4, the method may include the following steps.

At step S401, with the piezoelectric device, the pressure applied to the piezoelectric device is converted to a direct current (DC) signal, and the sound waves applied to the piezoelectric device are converted into alternating current (AC) signals.

At step S403, with the comparison circuit, it is determined whether the piezoelectric device outputs DC signal or AC signal. And with the comparison circuit, in the case that it is determined that the piezoelectric device outputs DC signal, the direct current signal is output to the signal processor, and in the case it is determined that the piezoelectric device outputs AC signal, the alternating current signal is output to the mixer.

At step S405, the received AC signal is mixed by the mixer to generate a mixed signal.

At step S407, the mixer signal output from the mixer or the direct current signal output from the comparison circuit is processed by the signal processor to identify the pressure or the sound. In other words, the signal processor may perform sound recognition based on the mixed signal output from the mixer or perform pressure recognition based on the DC signal output from the comparison circuit.

Figure 5:
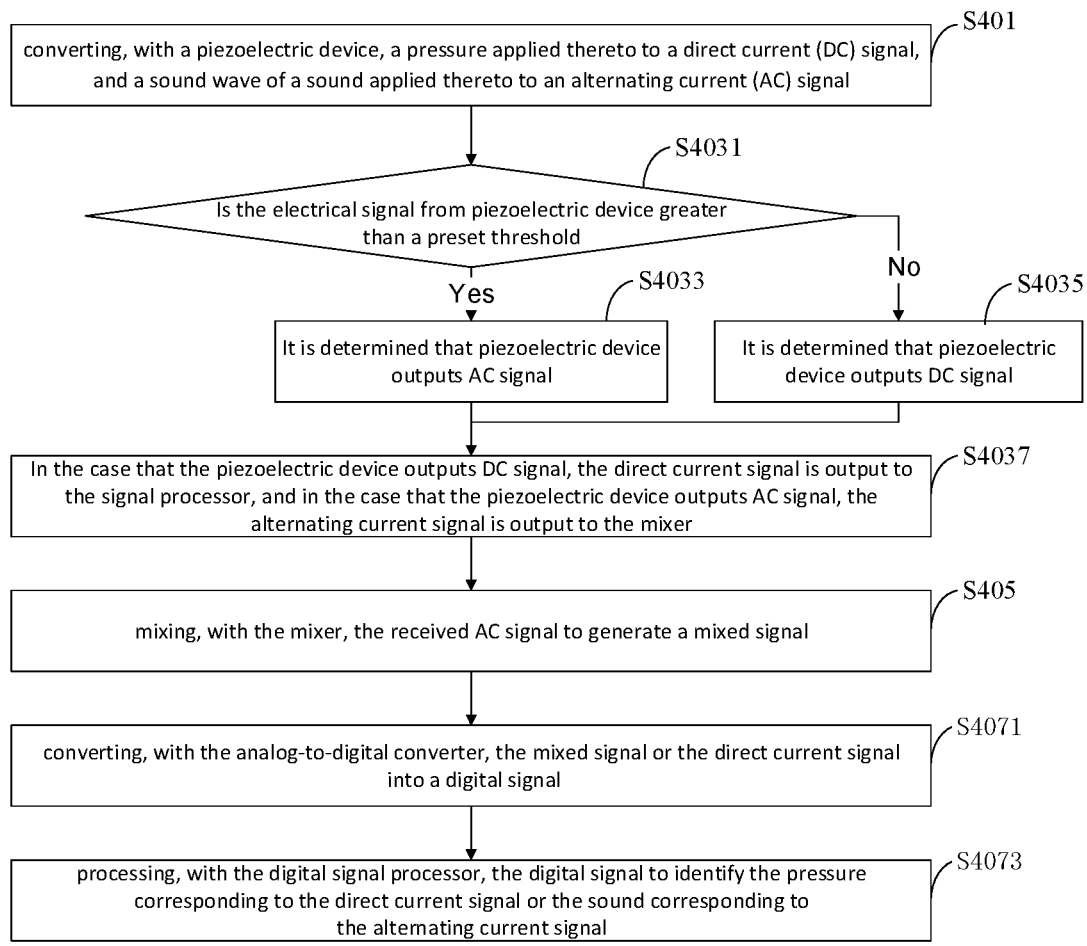
FIG. 5 is a specific flowchart of a detecting method for a piezoelectric detection circuit according to an embodiment of the present disclosure.

FIG. 5 illustrates a more specific method according to further embodiments of the present disclosure. In FIG. 5, the same steps as those in FIG. 4 are denoted by the same reference numerals. FIG. 5 also shows sub-steps of the some steps shown in FIG. 4 which sub-steps are denoted with reference numerals which are similar to the reference numerals indicating the corresponding steps of FIG. 4 but have an additional number added.

In some embodiments, step S403 may further include the following sub-steps. In sub-step S4031, it is determined by the comparison circuit whether the electrical signal output by the piezoelectric device is greater than a preset threshold. If so, it is determined that the piezoelectric device outputs an alternating current signal (sub-step S4033). If not, it is determined that the piezoelectric device outputs a direct current signal (sub-step S4035). In the sub-step S4037, with the comparison circuit, when it is determined that the piezoelectric device outputs the direct current signal, the direct current signal is output to the signal processor, and when it is determined that the piezoelectric device outputs the alternating current signal, the alternating current signal is output to the mixer.

In addition, in some embodiments, the signal processor may include an analog-to-digital converter and a digital signal processor. Accordingly, step S407 may further include the following sub-steps. In sub-step S4071, with the analog-to-digital converter the received mixed signal or direct current signal is converted to a digital signal. In sub-step S4073, with the digital signal processor, the digital signal is processed to identify the pressure corresponding to the DC signal or the sound corresponding to the AC signal.

FIG. 5 also shows a step S401 at which with a piezoelectric device, the pressure applied thereto is converted into a direct current signal, and the sound wave of the sound applied thereto is converted into an alternating current signal. FIG. 5 also shows a step S405 at which the received AC signal is subjected to a mixing process by a mixer and thus a mixed signal is generated. The content described above with respect to the corresponding steps shown in FIG. 4 may apply equally or adaptively thereto.

According to some embodiments of the present disclosure, a display device is further provided that may include a piezoelectric detection circuit according to any of the embodiments disclosed herein or any other embodiments that may be apparently obtained from the present disclosure. The display device may include, but not be limited to, any product or component having a display function such as a cell phone, a tablet, a television, a display, a notebook computer, a digital photo frame, a navigator and the like.

Figure 6:
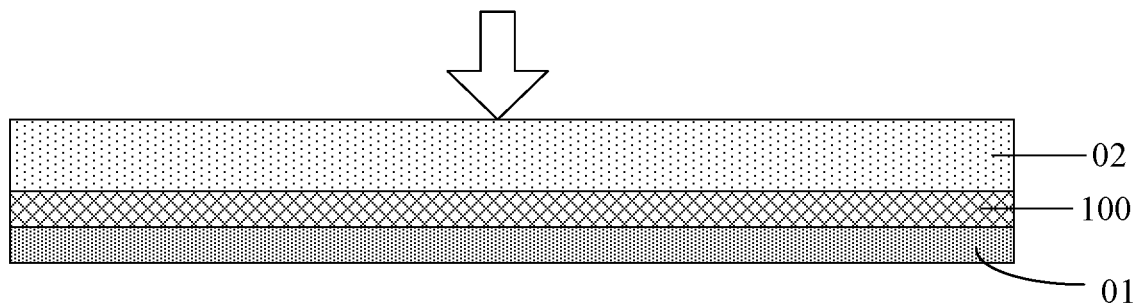
FIG. 6 is a schematic structural diagram of a display device according to an embodiment of the present disclosure.

In some embodiments, there is provided a display device that may include a display panel, and a piezoelectric detection circuit according to any of the embodiments. As shown in FIG. 6, the display device may include a display panel 01 and the piezoelectric detection circuit 100.

In some embodiments, as shown in FIG. 6, the display device may further include a protective cover 02 covering the display panel 01. The piezoelectric device 100 in the piezoelectric detection circuit may be disposed on a side of the protective cover 02 facing the display panel 01. The side of the protective cover 02 facing away from the display panel 01 (i.e., the side indicated by the arrow in FIG. 6) may be a display surface, and the side of the protective cover facing the display panel 01 may be the back side thereof. It is to be noted that the present disclosure shall not be limited to such an embodiment as shown in FIG. 6. For example, in other embodiments, a plurality of film layers may be disposed on the back side of the cover, and the piezoelectric device 100 may be disposed onto any film layer on the back side of the protection cover 02.

FIGS. 7a to 7d are schematic structural diagrams of liquid crystal display panels according to embodiments of the present disclosure. In some embodiments, as shown in FIG. 7a to FIG. 7d, the display panel 01 may be a liquid crystal display panel. Specifically, the liquid crystal display panel may include an array substrate 011 and an opposite substrate 012 opposite to each other, and a liquid crystal layer 013 disposed between the opposite substrate 012 and the array substrate 011. The liquid crystal layer may include liquid crystals as schematically shown and indicated with 701 in the drawings.

Figure 7A:
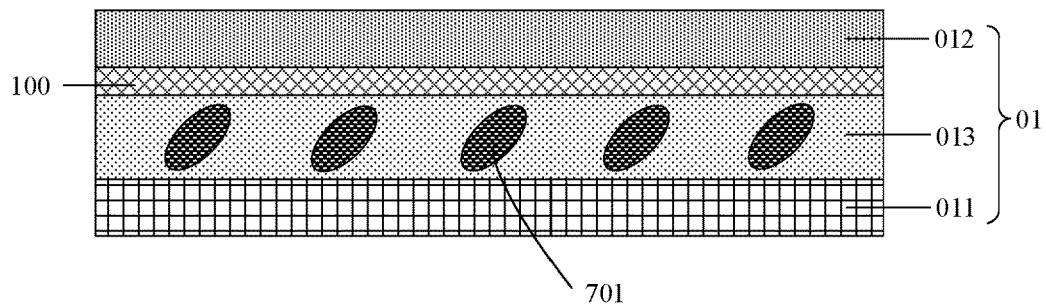
FIGS. 7a to 7d are respectively schematic structural diagrams of liquid crystal display panels according to embodiments of the present disclosure.
Figure 7B:
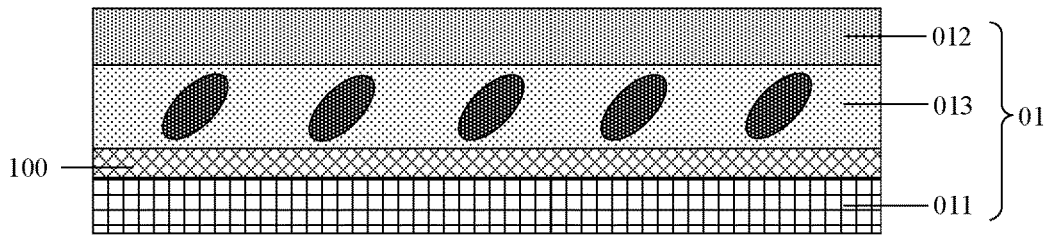
Figure 7C:
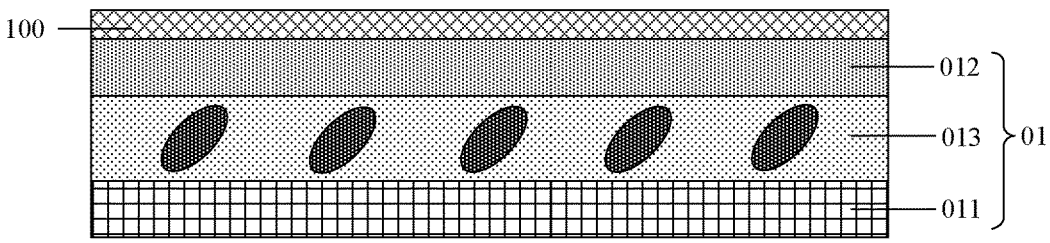
Figure 7D:
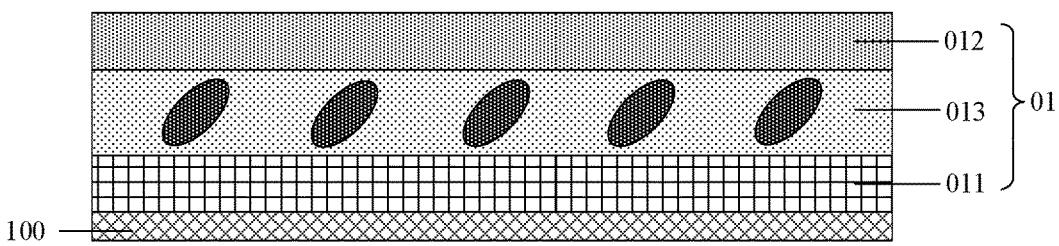

The piezoelectric device 100 may be located within the liquid crystal display panel. For example, as shown in FIG. 7a, the piezoelectric device 100 may be disposed on a side of the opposite substrate 012 facing the liquid crystal layer 013. Alternatively, as shown in FIG. 7b, the piezoelectric device 100 may be disposed on a side of the array substrate 011 facing the liquid crystal layer 013. Alternatively, the piezoelectric device 100 may be located outside the liquid crystal display panel. For example, as shown in FIG. 7c, the piezoelectric device 100 may be disposed on a side of the opposite substrate 012 facing away from the liquid crystal layer 013. Alternatively, as shown in FIG. 7d, the piezoelectric device 100 may be disposed on a side of the array substrate 011 facing away from the liquid crystal layer 013.

Other elements in the piezoelectric detection circuit, such as the comparison circuit 200, the mixer 300 and the signal processor 400, may be formed as external module(s) or may be integrated on the display panel.

Figure 8A:
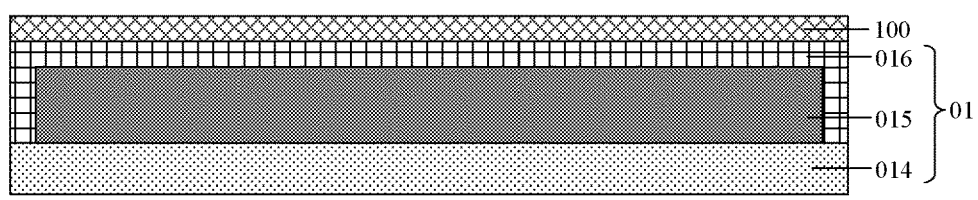
FIGS. 8a-8c are respectively structural schematic diagrams of display devices according to embodiments of the present disclosure where the display device is an organic electroluminescent display panel.
Figure 8B:
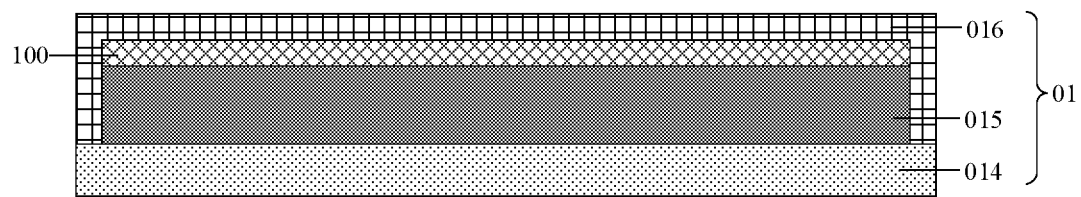
Figure 8C:
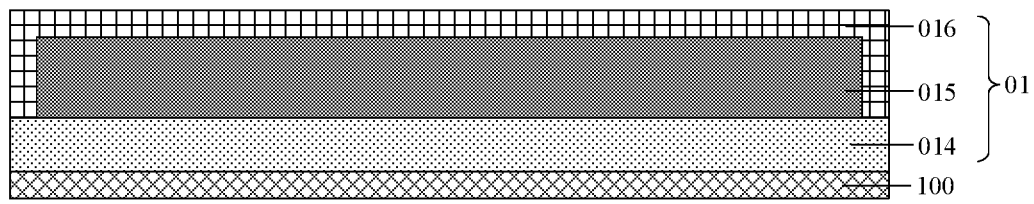

FIGS. 8a to 8c are respectively schematic structural diagrams of the display devices according to embodiments of the present disclosure wherein the display device is an organic electroluminescent display panel. In some embodiments, as shown in FIG. 8a to FIG. 8c, the display panel 01 may be an organic electroluminescent display panel. Specifically, the organic electroluminescent display panel may include a base substrate 014, an organic electroluminescent device 015 disposed on the base substrate 014, and an encapsulating film layer 016 covering the organic electroluminescent device 015.

The piezoelectric device 100 may be located outside the package film. For example, as shown in FIG. 8a, the piezoelectric device 100 may be disposed on a side of the encapsulating film layer that faces away from the organic electroluminescent device 015. Alternatively, the piezoelectric device 100 may be located inside the package, that is, within the display panel. For example, as shown in FIG. 8b, the piezoelectric device 100 may be disposed between the encapsulating film layer 016 and the organic electroluminescent device 015. Alternatively, the piezoelectric device 100 may also be located outside the substrate. As shown in FIG. 8 c, the piezoelectric device 100 may be disposed on a side of the base substrate 014 facing away from the organic electroluminescent device 015.

Figure 9A:
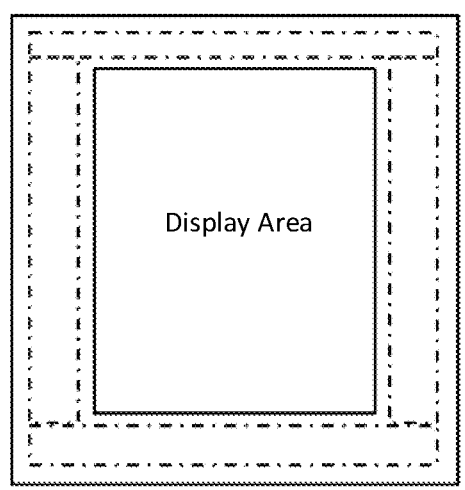
FIGS. 9a and 9b are respectively top views of display devices according to embodiments of the present disclosure.
Figure 9B:
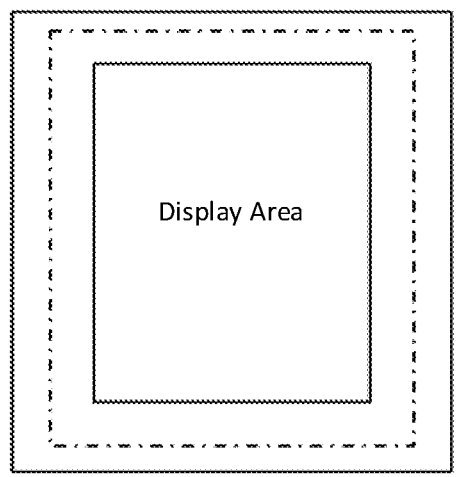

FIGS. 9a and 9b are respectively top views of display devices according to embodiments of the present disclosure. In some embodiments, in the case where the upper electrode 111, the lower electrode 113 and the piezoelectric material layer 112 in the piezoelectric device 100 are formed of opaque materials, as shown in FIG. 9a, the piezoelectric device 100 in the piezoelectric detection circuit may be disposed in the non-display area of the display panel. In the case that the upper electrode 111, the lower electrode 113 and the piezoelectric material layer 112 in the piezoelectric device 100 are formed of transparent materials, as shown in FIG. 9b, the piezoelectric device 100 may be provided at the display area and the non-display area of the display panel.

According to the piezoelectric detection circuits, the detection methods and the display devices according to various embodiments of the present disclosure, the functions of pressure detection and sound wave detection can be achieved with a single piezoelectric device, and the complexity of the detection circuit is thus reduced. And, it facilitates the integration of the detection circuit into a display device, also costs and power consumptions can be reduced.

Those skilled in the related art will readily understand that the boundaries between the above operations are merely illustrative. Multiple operations may be combined into a single operation, a single operation may be distributed among additional operations, and operations may be performed at least partially overlapping in time. Moreover, alternative embodiments may include multiple instances of a particular operation, and the order of operations may be changed in other various embodiments. Thus, other modifications, changes and substitutions are also possible. Accordingly, the specification and drawings shall be regarded in an illustrative rather than a restrictive sense.

As used herein, the terms "a" or "an" are defined as one or more than one. Also the use of introductory phrases such as "at least one" and "one or more" in the claims should not be construed to imply that the introduction of another element by the indefinite article "a" or "an" limits any particular claim containing such introduced claim element to inventions that contain only one such element, even if the same claim includes the introductory phrases "one or more" or "at least one" and indefinite articles. The same holds true for the use of definite articles ("the"). Unless otherwise specified, words such as "first" and "second" are used to arbitrarily distinguish between the elements such terms describe. These words are not necessarily intended to indicate the chronological order or other order of such elements, and the mere fact that certain measures are recited in different claims does not indicate that a combination of these measures cannot be used to advantage.

It is also to be noted that the term "comprise/comprising" when used herein indicates the presence of the specified features, integers, steps, operations, elements, and/or components, but does not preclude the presence or addition of one or more other features, integers, steps, operations, elements and/or components, and/or groups thereof.

Although some specific embodiments of the present invention have been described in detail by way of example, those skilled in the art would understand that the above examples are only for the purpose of illustration and are not intended to limit the scope of the present invention. The various embodiments disclosed herein may be combined in any combination without departing from the spirit and scope of the invention. Obviously, those skilled in the art can make various modifications and variations to the embodiments of the present disclosure without departing from the spirit and scope of the disclosure. In this way, if these modifications and variations fall within the scope of the claims of the present application and the equivalent thereof, the present disclosure is also intended to embrace these modifications and variations.

What is claimed is:

1. A piezoelectric detection circuit comprising:
    a piezoelectric device configured to convert a pressure applied thereto into a direct current (DC) signal and to convert a sound wave of a sound applied thereto into an alternating current (AC) signal;
    a comparison circuit configured to output the DC signal to a signal processor in a case where it is determined that the piezoelectric device outputs DC signal, and to output the AC signal to a mixer in a case where it is determined that the piezoelectric device outputs AC signal;

the mixer configured to perform a mixing process on the AC signal to generate a mixed signal; and the signal processor configured to process the mixed signal output from the mixer or the DC signal output from the comparison circuit, to detect the pressure or the sound.

2. The piezoelectric detection circuit according to claim 1, wherein the signal processor comprises an analog-to-digital converter and a digital signal processor, wherein the analog-to-digital converter is configured to convert the mixed signal or the DC signal into a digital signal; and the digital signal processor is configured to process the digital signal to identify the pressure corresponding to the DC signal or the sound corresponding to the AC signal.

3. The piezoelectric detection circuit according to claim 1, wherein the piezoelectric device comprises one or more piezoelectric sensors which are provided independently of each other, each piezoelectric sensor comprising: an upper electrode, a piezoelectric material layer and a lower electrode which are stacked.

4. The piezoelectric detection circuit according to claim 3, wherein the piezoelectric material layer comprises a polymer material.

5. The piezoelectric detection circuit according to claim 4, wherein at least one of the upper electrode or the lower electrode is an organic conductive material electrode; and wherein the piezoelectric sensor further comprises: a frame-type electrode formed of a metal material and electrically coupled to the organic conductive material electrode, wherein shapes respectively formed by outer edges and inner edges of the frame-type electrode are consistent with a shape formed by outer edges of the organic conductive material electrode.

6. The piezoelectric detection circuit according to claim 1, wherein the comparison circuit comprises:

a comparator configured to compare the signal output from the piezoelectric device with a preset threshold to determine whether the piezoelectric device outputs DC signal or AC signal; and a splitter configured to output, based on a result of the determination, the DC signal to the signal processor and the AC signal to the mixer.

7. A display device comprising a display panel and the piezoelectric detection circuit according to claim 1.

8. The display device of claim 7, further comprising:

a cover covering the display panel, wherein the piezoelectric device of the piezoelectric detection circuit is disposed on a side of the cover facing the display panel.

9. The display device according to claim 7, wherein:

the display panel is a liquid crystal display panel, the liquid crystal display panel comprising: an array substrate and an opposite substrate arranged opposite to each other, and a liquid crystal layer provided between the opposite substrate and the array substrate; and the piezoelectric device is disposed at any one of: a side of the opposite substrate facing the liquid crystal layer, a side of the array substrate facing the liquid crystal layer, a side of the opposite substrate facing away from the liquid crystal layer, or a side of the array substrate facing away from the liquid crystal layer.

10. The display device according to claim 7, wherein:

the display panel is an organic electroluminescent display panel, the organic electroluminescent display panel comprising: a base substrate, an organic electroluminescent device disposed on the base substrate, and an encapsulating film layer covering the organic electroluminescent device; and the piezoelectric device is disposed at any one of: a side of the encapsulating film layer facing away from the organic electroluminescent device, between the encapsulating film layer and the organic electroluminescent device, or a side of the base substrate facing away from the organic electroluminescent device.

11. The display device according to claim 7, wherein the piezoelectric device in the piezoelectric detection circuit is located in a non-display area of the display panel, or located in a display area and a non-display area of the display panel.

12. A method comprising:

converting, with a piezoelectric device, a pressure applied to the piezoelectric device to a direct current (DC) signal, and a sound wave of a sound applied to the piezoelectric device to an alternating current (AC) signal;

determining, with a comparison circuit, whether the piezoelectric device outputs DC signal or AC signal, and outputting the DC signal to a signal processor where it is determined that the piezoelectric device outputs DC signal, and the AC signal to a mixer where it is determined that the piezoelectric device outputs AC signal;

mixing, with the mixer, the AC signal to generate a mixed signal; and processing, with the signal processor, the mixed signal output from the mixer or the DC signal output from the comparison circuit to detect the pressure or the sound.

13. The method of claim 12, wherein the signal processor comprises an analog-to-digital converter and a digital signal processor, and wherein processing, with the signal processor, the mixed signal output from the mixer or the DC signal output from the comparison circuit to detect the pressure or the sound comprises:

converting, with the analog-to-digital converter, the received mixed signal or the DC signal into a digital signal; and processing, with the digital signal processor, the digital signal to identify the pressure corresponding to the DC signal or the sound corresponding to the AC signal.

14. The method of claim 12, wherein said determining and outputting comprises:

comparing, with a comparator, the signal output from the piezoelectric device with a preset threshold to determine whether the piezoelectric device outputs DC signal or AC signal; and outputting, with a splitter based on a result of the determination, the DC signal to the signal processor and the AC signal to the mixer.

* * * * *